(12) United States Patent
Hsu et al.

(10) Patent No.: US 8,471,285 B2
(45) Date of Patent: Jun. 25, 2013

(54) LIGHT-EMITTING DIODE PACKAGE INCLUDING A CAVITY WITH A PLURALITY OF SIDE-WALLS WITH DIFFERENT INCLINATIONS

(75) Inventors: Chin-Chang Hsu, Pingtung (TW); Wen-Lung Su, Puli Township (TW)

(73) Assignee: Lextar Electronics Corp., Hsinchu (TW)

( * ) Notice: Subject to any disclaimer, the term of this patent is extended or adjusted under 35 U.S.C. 154(b) by 71 days.

(21) Appl. No.: 13/154,306

(22) Filed: Jun. 6, 2011

(65) Prior Publication Data

US 2011/0233594 A1   Sep. 29, 2011

Related U.S. Application Data

(62) Division of application No. 12/164,114, filed on Jun. 30, 2008, now Pat. No. 8,030,674.

(30) Foreign Application Priority Data

Apr. 28, 2008   (TW) .............................. 097115580 A
Apr. 28, 2008   (TW) .............................. 097207314 U

(51) Int. Cl.
 *H01L 33/00*   (2010.01)
 *H01L 23/495*   (2006.01)

(52) U.S. Cl.
 USPC ............................... 257/98; 257/99; 257/676

(58) Field of Classification Search
 USPC ............................... 257/98, 99, 676, E33.058
 See application file for complete search history.

(56) References Cited

U.S. PATENT DOCUMENTS

| 2006/0097366 A1 | 5/2006 | Sirinorakul et al. |
| 2007/0262328 A1* | 11/2007 | Bando ............................ 257/79 |
| 2008/0099779 A1* | 5/2008 | Huang et al. ................... 257/99 |

FOREIGN PATENT DOCUMENTS

TW   M295725   8/2006

OTHER PUBLICATIONS

Luo et al., "Trapped Whispering-Gallery Optical Modes in White Light-Emitting Diode Lamps with Remote Phosphor", Applied Physics Letters 89, 041125 (2006), pp. 1-3.

* cited by examiner

*Primary Examiner* — William M. Brewster
(74) *Attorney, Agent, or Firm* — Liu & Liu

(57) ABSTRACT

An LED package including a lead-frame, at least an LED chip and an encapsulant is provided. The lead-frame has a roughened surface, the LED chip is disposed on the lead-frame and electrically connected to the lead-frame, and the roughened surface is suitable to scatter the light emitted from the LED chip. In addition, the encapsulant encapsulates the LED chip and a part of the lead-frame, and the rest part of the lead-frame is exposed out of the encapsulant.

20 Claims, 7 Drawing Sheets

LIGHT-EMITTING DIODE PACKAGE INCLUDING A CAVITY WITH A PLURALITY OF SIDE-WALLS WITH DIFFERENT INCLINATIONS

CROSS REFERENCE TO RELATED APPLICATIONS

This application is a Divisional of U.S. patent application Ser. No. 12/164,114, filed Jun. 30, 2008 now U.S. Pat. No. 8,030,674, which claims the priority benefits of Taiwan applications serial no. 97115580 and 97207314, both filed on Apr. 28, 2008. The entirety of each of the above-mentioned patent application is hereby incorporated by reference herein and made a part of specification.

BACKGROUND OF THE INVENTION

1. Field of the Invention

The present invention generally relates to a light-emitting diode package (LED package), and more particularly, to an LED package with high light-emitting efficiency.

2. Description of Related Art

An LED is counted as one of semiconductor devices, and an LED chip is mainly made of compounds of groups III-V, for example, gallium phosphide (GaP), gallium arsenide (GaAs) or other semiconductor compounds. The LED functions to emit light through converting electrical energy into light. I more detail, when a current is applied to an LED, the electrons and the holes in the LED are re-combined for releasing photons so as to emit light. Since an LED emits light not by heating or arc-discharging to be realized, thus, an LED has a long lifetime over a hundred of thousands hours; additionally, no idling time is needed to start operating. In fact, an LED has many advantages, such as fast response speed (about $10^{-9}$ second), small size, power-saving, low pollution, high reliability and suitability for mass production; therefore, the LED is widely used in various fields, for example, light sources used in mega-size display board, traffic light, handset, scanner, fax machine, and illumination devices. Due to the light-emitting luminance and the light-emitting efficiency of an LED have been steadily enhanced. It is noted that, white LEDs are capable of being successfully mass-produced now, the LEDs start to be applied in display or illumination products.

FIG. 1 is a schematic cross-sectional drawing of a conventional LED package. Referring to FIG. 1, a conventional LED package 100 includes a lead-frame 110, a light-emitting diode chip (LED chip) 120 and an encapsulant 130. The lead-frame 110 has a surface 110a and the surface 110a is a specular surface for reflecting the light emitted from the LED chip 120. The LED chip 120 is disposed on the lead-frame 110 and is electrically connected to the lead-frame 110. Additionally, the encapsulant 130 encapsulates the LED chip 120 and a part of the lead-frame 110 such that and the rest part of the lead-frame 110 is exposed out of the encapsulant 130 and serves as an external electrode E.

As shown in FIG. 1, the encapsulant 130 comprises a casing 132 and a first light-transmitting portion 134. The casing 132 has a cavity 132a, the LED chip 120 is located in the cavity 132a and the cavity 132a has a side-wall S with a fixed inclination. The light-transmitting portion 134 is disposed in the cavity 132a and joined with the casing 132. The light-transmitting portion 134 encapsulates the LED chip 120 and the part of the lead-frame 110 that is not encapsulated by the casing 132.

As shown in FIG. 1, although the specular surface of the lead-frame 110 reflects light very well, the light emitted from the LED chip 120 and the light reflected by the partial lead-frame 110 encapsulated by the light-transmitting portion 134 might be stayed inside the light-transmitting portion 134 of the encapsulant 130 due to total internal reflections, so as to reduce the overall light-emitting efficiency of the conventional LED package 100.

SUMMARY OF THE INVENTION

Accordingly, the present invention is directed to an LED package with good light-emitting efficiency.

The present invention provides an LED package including a lead-frame, at least an LED chip and an encapsulant, wherein the lead-frame has a roughened surface, the LED chip is disposed on the lead-frame and electrically connected to the lead-frame, and the roughened surface is suitable to scatter the light emitted from the LED chip. The encapsulant encapsulates the LED chip and a part of the lead-frame, and the rest part of the lead-frame is exposed out of the encapsulant.

In an embodiment of the present invention, the above-mentioned lead-frame includes a plurality of leads, and each of the leads comprises an inner-lead and an outer-lead, wherein the inner-lead is encapsulated by the encapsulant and electrically connected to the LED chip; the outer-lead is exposed out of the encapsulant.

In an embodiment of the present invention, each of the above-mentioned inner-leads has the above-mentioned roughened surface.

In an embodiment of the present invention, each of the above-mentioned inner-leads and outer-leads has the above-mentioned roughened surface.

In an embodiment of the present invention, each of the above-mentioned outer-leads is extended from the side-wall of the encapsulant to the bottom of the encapsulant.

In an embodiment of the present invention, the above-mentioned encapsulant includes a casing and a light-transmitting portion, wherein the casing has a cavity and the LED chip is located in the cavity. The light-transmitting portion is disposed in the cavity and joined with the casing. The light-transmitting portion encapsulates the LED chip and a partial region of the inner-lead not encapsulated by the casing.

In an embodiment of the present invention, the above-mentioned partial region of the inner-lead encapsulated by the light-transmitting portion has the above-mentioned roughened surface.

In an embodiment of the present invention, the above-mentioned partial region encapsulated by the casing has the above-mentioned roughened surface.

The present invention provides an LED package including a lead-frame, at least an LED chip and an encapsulant, wherein the LED chip is disposed on lead-frame and electrically connected to the lead-frame, the encapsulant encapsulates the LED chip and a part of the lead-frame, such that the rest part of the lead-frame is exposed out of the encapsulant. Moreover, the encapsulant includes a casing and a first light-transmitting portion. The casing has a first cavity in which the LED chip is located. Besides, the first cavity has a plurality of side-walls with different inclinations, respectively. The first light-transmitting portion is disposed in the first cavity and joined with the casing, wherein the first light-transmitting portion encapsulates the LED chip and a partial region of the lead-frame not encapsulated by the casing.

In an embodiment of the present invention, the above-mentioned lead-frame has a roughened surface, and the roughened surface is suitable to scatter the light emitted from the LED chip. Additionally, the roughened surface has a roughness ranging from 0.05 µm to 500 µm, for example.

In an embodiment of the present invention, the lead-frame includes a plurality of leads. Each of the leads includes an inner-lead and an outer-lead. The inner-lead is encapsulated by the encapsulant and electrically connected to the LED chip, and the outer-lead is exposed out of the encapsulant.

In an embodiment of the present invention, each of the inner-leads has the roughened surface. That is to say, the roughtened surface is located on each of the inner-leads, while the roughtened surface can be simultaneously located on each of the inner-leads and each of the outer-leads in other embodiments of the present invention.

In an embodiment of the present invention, each of the outer-leads is extended from the side-wall of the encapsulant to the bottom of the encapsulant.

In an embodiment of the present invention, the partial regions of the inner-leads encapsulated by the first light-transmitting portion respectively have the roughened surface. Namely, the roughtened surface is merely distributed on the inner-leads encapsulated by the first light-transmitting portion, while the roughened surface can be simultaneously distributed on the inner-leads encapsulated by the casing and the first light-transmitting portion.

In an embodiment of the present invention, the LED package further includes a second light-transmitting portion, and the casing further has a second cavity for accommodating an electronic device and the second light-transmitting portion that is located in the second cavity and connected to the casing. The second light-transmitting portion encapsulates the electronic device and a partial region of the lead-frame not encapsulated by the casing, and the first light-transmitting portion and the second light-transmitting portion are respectively positioned at two opposite sides of the lead-frame.

In an embodiment of the present invention, the first cavity has a greater dimension than the second cavity does.

In an embodiment of the present invention, the electronic device is, for example, an LED chip, an electrostatic protection chip, a control chip, or other types of chips.

Since the casing has the first cavity in the present invention, and the first cavity is equipped with the side-walls having different inclinations, the LED package of the present invention is characterized by fantastic luminous efficacy.

In an embodiment of the present invention, the above-mentioned roughened surface has a roughness ranging from 0.05 µm to 500 µm.

Since the present invention adopts a lead-frame having a scattering surface as a chip carrier, the LED package provided by the present invention has good light-emitting efficiency.

BRIEF DESCRIPTION OF THE DRAWINGS

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

Figure 1:
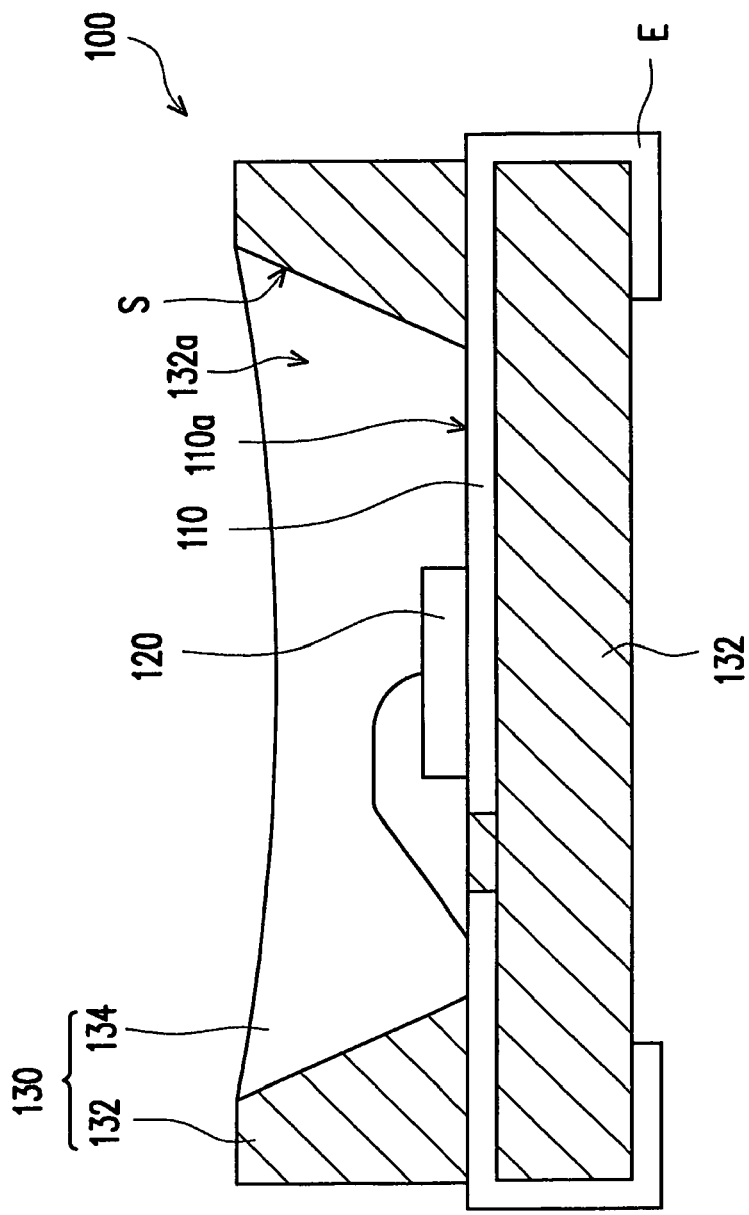
FIG. 1 is a schematic cross-sectional drawing of a conventional LED package.

Reference will now be made in detail to the present preferred embodiments of the invention, examples of which are illustrated in the accompanying drawings. Wherever possible, the same reference numbers are used in the drawings and the description to refer to the same or like parts.

[The First Embodiment]

Figure 2:
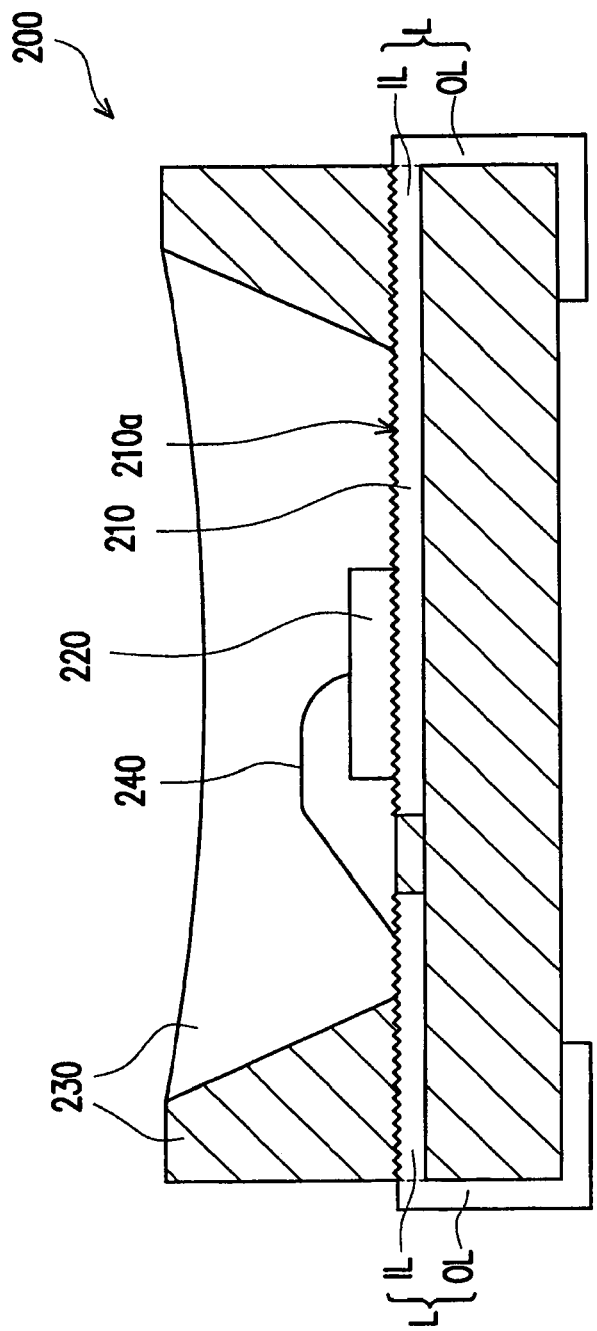
FIGS. 2 and 3 are schematic cross-sectional drawings of an LED package according to the first embodiment of the present invention.
Figure 3:
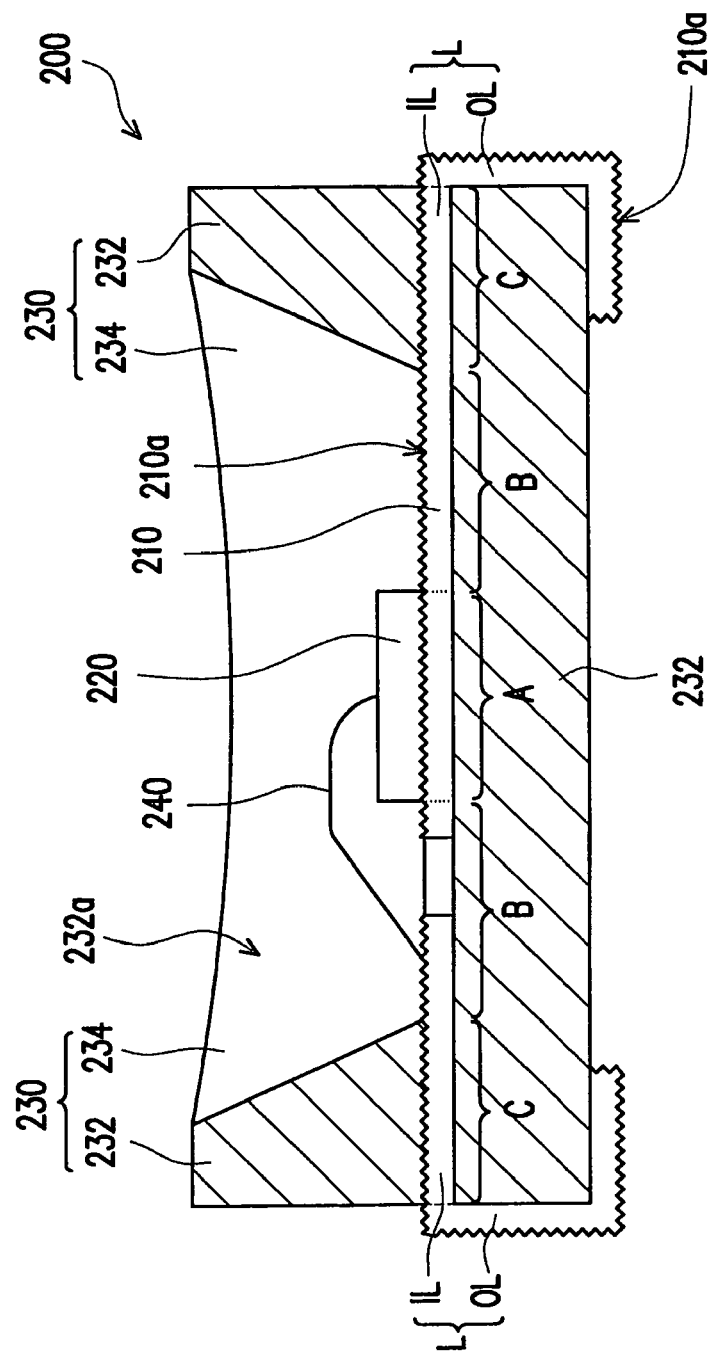

FIGS. 2 and 3 are schematic cross-sectional drawings of an LED package according to the first embodiment of the present invention. Referring to FIGS. 2 and 3, an LED package 200 of the first embodiment includes a lead-frame 210, at least an LED chip 220 and an encapsulant 230. The lead-frame 210 has a roughened surface 210a, and the LED chip 220 is disposed on the lead-frame 210 and electrically connected to the lead-frame 210. In the embodiment, the LED chip 220 is electrically connected to the lead-frame 210 through, for example, a bonding wire 240; however, the LED chip 220 can be electrically connected to the lead-frame 210 by flip-chip technology or other die-bonding processes. The encapsulant 230 encapsulates the LED chip 220 and a part of the lead-frame 210, and the rest part of the lead-frame 210 is exposed out of the encapsulant 230. In addition, the roughened surface 210a is suitable to scatter the light emitted from the LED chip 220. In the embodiment, the roughness of the roughened surface ranges, for example, from 0.05 µm to 500 µm.

As shown in FIGS. 2 and 3, the lead-frame 210 includes a plurality of leads L, and each of the leads L has an inner-lead IL and an outer-lead OL. The inner-lead IL is encapsulated by the encapsulant 230 and electrically connected to the LED chip 220. The outer-lead OL is exposed out of the encapsulant 230, and each of the outer-leads OL is, for example, extended from the side-wall of the encapsulant 230 to the bottom of the encapsulant 230. In the embodiment, the lead-frame 210 is, for example, copper lead-frame, aluminium lead-frame or other metal lead-frames. Depending on a practical requirements, the lead-frame 210 can be plated by a metal coating according to the embodiment. Besides, the lead-frame 210 employed by the present invention is not limited to the designs shown in FIGS. 2 and 3. In other words, the lead-frame 210 can have an up-set design or a down set design depending on the practical requirements; that is, the inner-leads encapsulated by the encapsulant 230 and the outer-leads OL can be respectively located at different elevations.

Note that a manufacturer is allowed to form the roughened surfaces 210a at different portions of the lead-frame 210, which would have different optical and mechanical effects (depicted hereinafter). For example, a manufacturer can form a roughened surface 210a on each inner-lead IL (as shown in FIG. 2). And, a manufacturer can faun roughened surfaces 210a on both the inner-leads IL and the outer-leads OL as well (as shown in FIG. 3).

When the roughened surfaces 210a are formed on the outer-leads OL of the lead-frame 210, the roughened surface 210a is helpful to join the LED package 200 and other carriers (for example, circuit board); when the roughened surfaces 210a are formed on the inner-leads IL of the lead-frame 210, the roughened surface 210a is helpful to join the lead-frame 210 itself and the encapsulant 230, so that a de-lamination unlikely occurs between the lead-frame 210 and the encapsulant 230.

In FIGS. 2 and 3, only a single surface of the lead-frame 210 is a roughened surface 210a, but it is allowed in the present invention to make two opposite surfaces of the lead-frame 210 have roughened surfaces 210a.

In an embodiment of the present invention, the encapsulant 230 includes a casing 232 and a light-transmitting portion 234, wherein the casing 232 has a cavity 232a and the LED chip 220 is located in the cavity 232a. The light-transmitting portion 234 is disposed in the cavity 232a and joined with the casing 232. The light-transmitting portion 234 encapsulates the LED chip 220 and a partial region of the inner-lead IL not encapsulated by the casing 232.

Forming the roughened surfaces 210a at different portions on the inner-lead IL brings different effects as well. When a roughened surface 210a is formed within the A region on the inner-lead IL, the formed roughened surface 210a can enhance the joining strength between the lead-frame 210 and the LED chip 220; when a roughened surface 210a is formed within the B region on the inner-lead IL, the formed roughened surface 210a can enhance the joining strength between the lead-frame 210 and the light-transmitting portion 234; when a roughened surface 210a is formed within the C region on the inner-lead IL, the formed roughened surface 210a can enhance the joining strength between the lead-frame 210 and the casing 232.

Note that a manufacturer can optionally select the A region, the B region or the C region to form a roughened surface 210a. A manufacturer can also select at least two regions among the A region, the B region and the C region to form the roughened surfaces 210a.

[The Second Embodiment]

Figure 4:
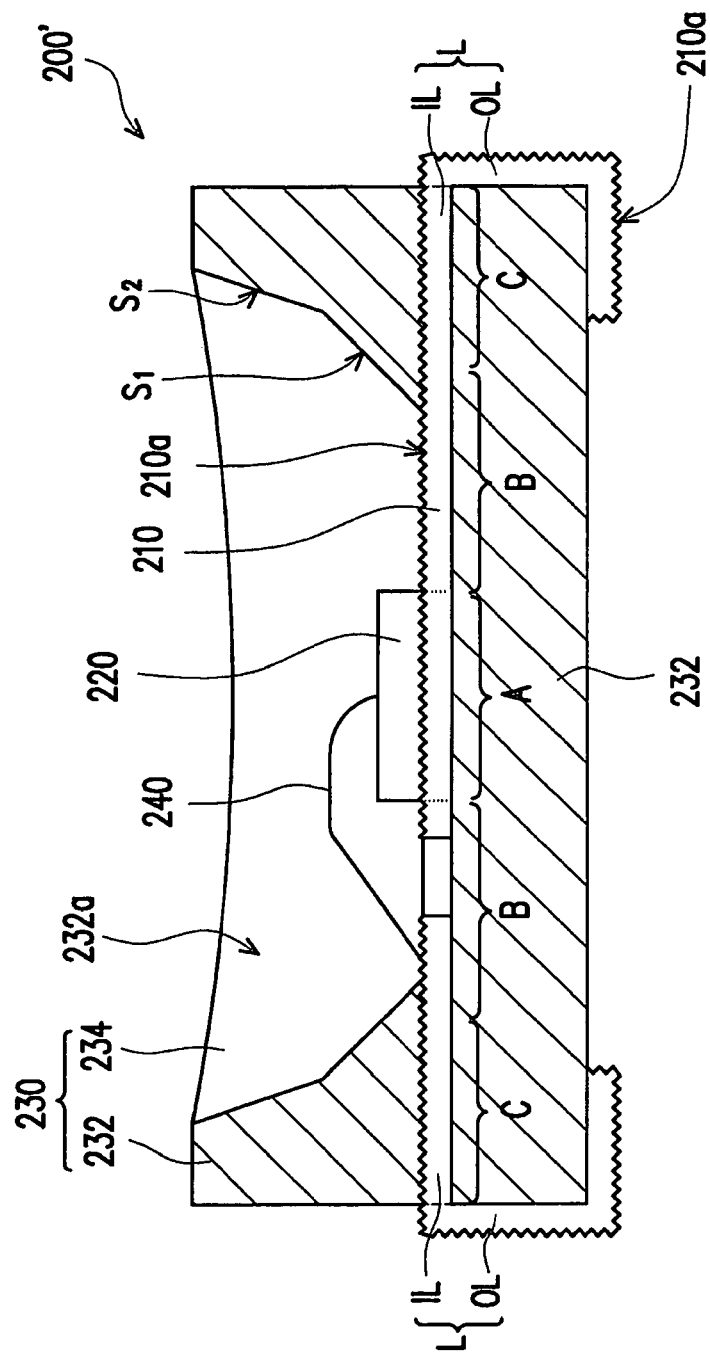
FIG. 4 is a schematic cross-sectional drawing of an LED package according to the second embodiment of the present invention.

FIG. 4 is a schematic cross-sectional drawing of an LED package according to the second embodiment of the present invention. Referring to FIG. 4, an LED package 200' of the second embodiment includes a lead-frame 210, at least an LED chip 220 and an encapsulant 230. The LED chip 220 is disposed on the lead-frame 210 and electrically connected to the lead-frame 210. In the embodiment, the LED chip 220 is electrically connected to the lead-frame 210 through, for example, a bonding wire 240; however, the LED chip 220 can be electrically connected to the lead-frame 210 by utilizing flip-chip technology or other die-bonding processes. The encapsulant 230 encapsulates the LED chip 220 and a part of the lead-frame 210, and the rest part of the lead-frame 210 is exposed out of the encapsulant 230. In addition, the encapsulant 230 includes a casing 232 and a first light-transmitting portion 134. The casing 232 has a first cavity 232a, the LED chip 220 is located in the first cavity 232a and the first cavity 232a has a plurality of side-wall sections S1 and S2 which respectively have different inclinations. The first light-transmitting portion 134 is disposed in the first cavity 232a and joined with the casing 232. The first light-transmitting portion 134 encapsulates the LED chip 220 and a partial region of the lead-frame 210 not encapsulated by the casing 232.

As shown in FIG. 4, the lead-frame 210 includes a plurality of leads L, and each of the leads L has an inner-lead IL and an outer-lead OL. The inner-lead IL is encapsulated by the encapsulant 230 and electrically connected to the LED chip 220. The outer-lead OL is exposed out of the encapsulant 230, and each of the outer-leads OL is, for example, extended from the side-wall of the encapsulant 230 to the bottom of the encapsulant 230. In the embodiment, the lead-frame 210 is, for example, copper lead-frame, aluminium lead-frame or other metal lead-frames. Depending on a practical requirements, the encapsulant 230 can be plated by a metal coating according to the embodiment. Besides, the lead-frame 210 employed by the present invention is not limited to the design shown in FIG. 4. In other words, the lead-frame 210 can have an up-set design or a down set design depending on the practical requirements; that is, the inner-leads encapsulated by the encapsulant 230 and the outer-leads OL can be respectively located at different elevations.

Note that a manufacturer is allowed to form the roughened surfaces 210a at different portions on the lead-frame 210, and the roughened surfaces 210a are suitable to scatter the light emitted from the LED chip 220, and the roughness of the roughened surface 210a ranges from 0.05 µm to 500 µm. In the embodiment, the roughened surfaces 210 can be formed at different portions on the lead-frame 210 to have different efficiencies (depicted hereinafter). For example, a manufacturer can form a roughened surfaces 210a on each inner-lead IL (as shown in FIG. 2). And, a manufacturer can form roughened surfaces 210a on both the inner-leads IL and the outer-leads OL as well (as shown in FIG. 4).

When the roughened surfaces 210a are formed on the outer-leads OL of the lead-frame 210, the roughened surface 210a is helpful to join the LED package 200' and other carriers (for example, circuit board); when the roughened surfaces 210a are formed on the inner-leads IL of the lead-frame 210, the roughened surface 210a is helpful to join the LED package 200 itself and the encapsulant 230, so that a de-lamination unlikely occurs between the lead-frame 210 and the encapsulant 230.

In FIG. 4, only a single surface of the lead-frame 210 is a roughened surface 210a, but it is allowed by the present invention to make two opposite surfaces of the lead-frame 210 roughened surfaces 210a.

Forming the roughened surfaces 210a at different portions on the inner-lead IL brings a different efficiency as well. When a roughened surface 210a is formed within an A region on the inner-lead IL, the formed roughened surface 210a can enhance the joining strength between the lead-frame 210 and the LED chip 220; when a roughened surface 210a is formed within a B region on the inner-lead IL, the formed roughened surface 210a can enhance the joining strength between the lead-frame 210 and the light-transmitting portion 234; when a roughened surface 210a is formed within a C region on the inner-lead IL, the formed roughened surface 210a can enhance the joining strength between the lead-frame 210 and the casing 232.

Note that a manufacturer can optionally select the A region, the B region or the C region to form a roughened surface 210a therewithin. A manufacturer can also select at least two regions among the A region, the B region and the C region to form the roughened surfaces 210a therewithin.

[The Third Embodiment]

Figure 5:
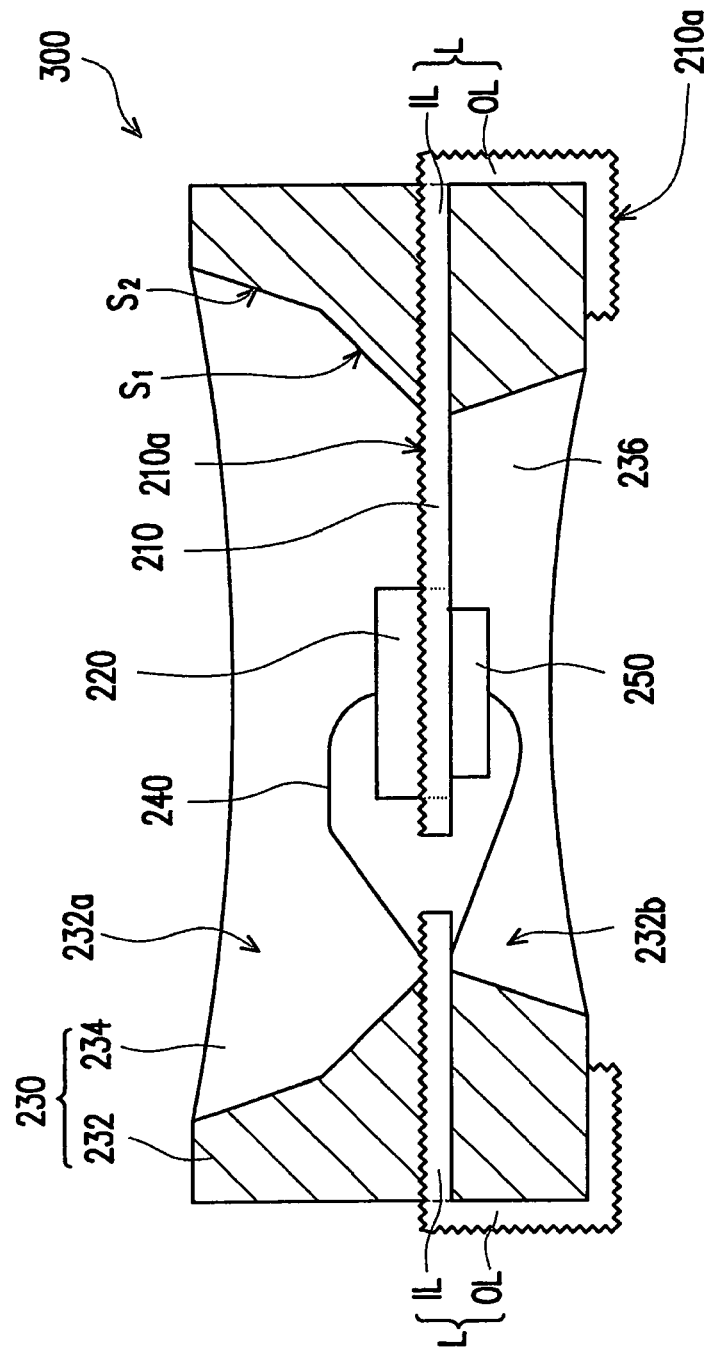
FIG. 5 is a schematic cross-sectional drawing of an LED package according to the third embodiment of the present invention.
Figure 6A:
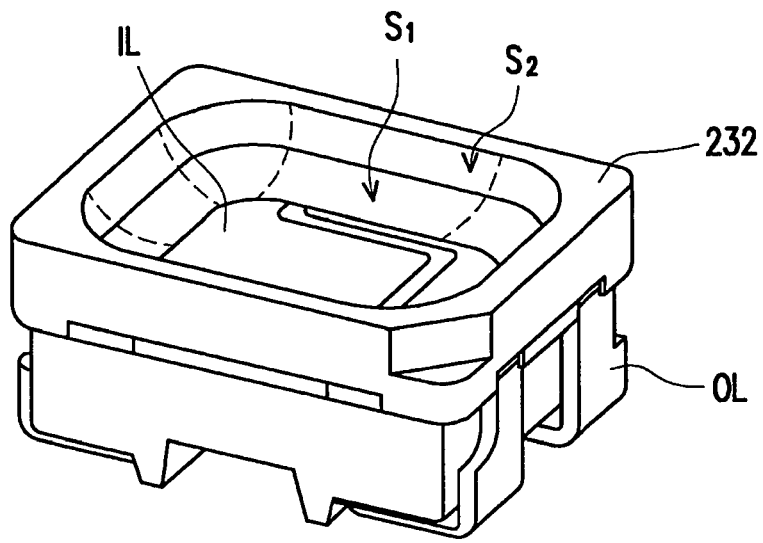
FIGS. 6A-6D are 3-D diagrams of a casing and a lead-frame in the third embodiment of the present invention.
Figure 6B:
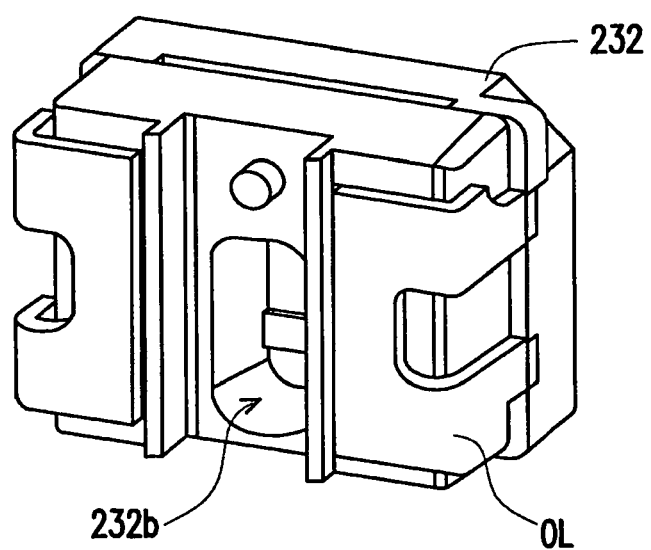
Figure 6C:
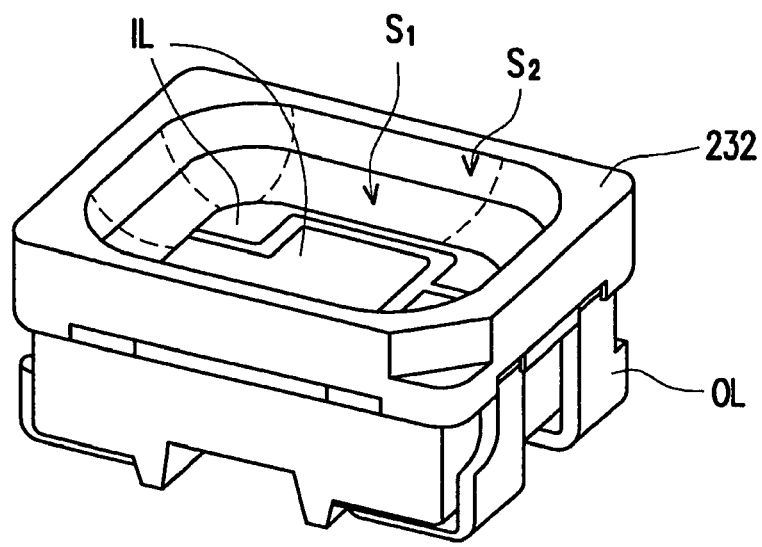
Figure 6D:
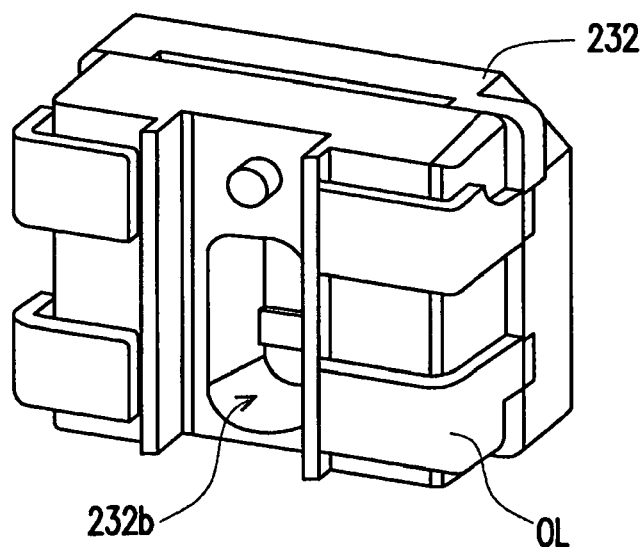

FIG. 5 is a schematic cross-sectional drawing of an LED package according to the third embodiment of the present invention and FIGS. 6A-6D are 3-D diagrams of a casing and a lead-frame in the third embodiment of the present invention. Referring to FIG. 5, an LED package 300 of the second embodiment is similar to the LED package 200' of the second embodiment except that the LED package 300 of the third embodiment further includes a second light-transmitting portion 236, and the casing 232 further has a second cavity 232b to accommodate an electronic device 250 and a second light-transmitting portion 236 (as shown in FIGS. 6A-6D). The second light-transmitting portion 236 is disposed in the second cavity 232b and joined with the casing 232. The second light-transmitting portion 236 encapsulates the electronic device 250 and a partial region of the lead-frame 210 not encapsulated by the casing 232. As shown in FIG. 5, the first light-transmitting portion 234 and the second light-transmitting portion 236 are respectively located at two opposite sides of the lead-frame 210. In addition, the size of the first cavity 232a is, for example, greater than the size of the second cavity 232b. Note that the electronic device 250 can be, for example, an LED chip, a static shield chip, a control chip or other chips.

In summary, the present invention has at least following advantages:

1. Since the present invention adopts a lead-frame with a scattering surface as the chip carrier, therefore, an LED package with higher light-emitting efficiency can be fabricated without largely increasing the manufacturing cost.

2. Since the casing in the present invention has a first cavity, and the first cavity has different side-wall sections respectively having a different inclination, therefore, the LED package of the present invention has good light-emitting efficiency.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light-emitting diode package, comprising:
   a lead-frame having a horizontal surface;
   at least a light-emitting diode chip, disposed on the horizontal surface of the lead-frame and electrically connected to the lead-frame; and
   an encapsulant, encapsulating the light-emitting diode chip and a part of the lead-frame, wherein a part of the lead-frame is exposed out of the encapsulant, the encapsulant comprising:
   a casing, having a first cavity, wherein the light-emitting diode chip is located in the first cavity, and the first cavity has a plurality of side-walls with different inclinations, respectively, wherein the inclinations are not orthogonal to the horizontal surface of the lead-frame in such a manner as to provide an increased light-emitting efficiency; and
   a first light-transmitting portion, disposed in the first cavity and joined with the casing, wherein the first light-transmitting portion encapsulates the light-emitting diode chip and a partial region of the lead-frame not encapsulated by the casing.

2. The light-emitting diode package according to claim 1, wherein the lead-frame has a roughened surface, and the roughened surface is suitable to scatter the light emitted from the light-emitting diode chip.

3. The light-emitting diode package according to claim 2, wherein the roughened surface has a roughness ranging from 0.05 μm to 500 μm.

4. The light-emitting diode package according to claim 1, wherein the lead-frame comprises a plurality of leads, each of the leads comprises an inner-lead and an outer-lead, the inner-lead is encapsulated by the encapsulant and electrically connected to the light-emitting diode chip, and the outer-lead is exposed out of the encapsulant.

5. The light-emitting diode package according to claim 4, wherein each of the inner-leads has the roughened surface.

6. The light-emitting diode package according to claim 4, wherein each of the inner-leads and each of the outer-leads have the roughened surface.

7. The light-emitting diode package according to claim 4, wherein each of the outer-leads is extended from the side-wall of the encapsulant to below the bottom of the encapsulant.

8. The light-emitting diode package according to claim 4, wherein the partial regions of the inner-leads encapsulated by the first light-transmitting portion respectively have the roughened surface.

9. The light-emitting diode package according to claim 8, wherein the partial regions of the inner-leads encapsulated by the casing respectively have the roughened surface.

10. The light-emitting diode package according to claim 1, further comprising a second light-transmitting portion, wherein the casing further has a second cavity for accommodating an electronic device and the second light-transmitting portion that is located in the second cavity and connected to the casing, the second light-transmitting portion encapsulates the electronic device and a partial region of the lead-frame not encapsulated by the casing, and the first light-transmitting portion and the second light-transmitting portion are respectively positioned at two opposite sides of the lead-frame.

11. The light-emitting diode package according to claim 10, wherein the first cavity has a greater dimension than the second cavity does.

12. The light-emitting diode package according to claim 10, wherein the electronic device comprises a light-emitting diode chip, an electrostatic protection chip, or a control chip.

13. A light-emitting diode package, comprising:
   a lead-frame having a horizontal surface and comprises a plurality of leads, each of the leads comprises an inner-lead and an outer-lead;
   at least a light-emitting diode chip, disposed on the horizontal surface of the lead-frame and electrically connected to the lead-frame; and
   an encapsulant, encapsulating the light-emitting diode chip and the inner-lead, comprising:
   a casing, having a first cavity, wherein the light-emitting diode chip is located in the first cavity, and the first cavity has a plurality of side-walls with different inclinations along a vertical direction, wherein included angles between each said inclination and the horizontal surface of the lead-frame are not orthogonal and increases in the vertical direction away from the horizontal surface of the lead-frame; and a first light-transmitting portion, disposed in the first cavity and joined with the casing, wherein the first light-transmitting portion encapsulates the light-emitting diode chip and a partial region of the lead-frame not encapsulated by the casing;

wherein the inner-lead is electrically connected to the light-emitting diode chip, and wherein each of the outer-leads is extended from the side-wall of the encapsulant to below the bottom of the encapsulant.

14. The light-emitting diode package according to claim 13, wherein each of the inner-leads has a roughened surface, the roughened surface has a roughness ranging from 0.05 μm to 500 μm.

15. The light-emitting diode package according to claim 13, wherein each of the inner-leads and each of the outer-leads have a roughened surface, the roughened surface has a roughness ranging from 0.05 μm to 500 μm.

16. The light-emitting diode package according to claim 13, wherein the partial regions of the inner-leads encapsulated by the first light-transmitting portion respectively have the roughened surface.

17. The light-emitting diode package according to claim 16, wherein the partial regions of the inner-leads encapsulated by the casing respectively have the roughened surface.

18. The light-emitting diode package according to claim 13, further comprising a second light-transmitting portion, wherein the casing further has a second cavity for accommodating an electronic device and the second light-transmitting portion that is located in the second cavity and connected to the casing, the second light-transmitting portion encapsulates the electronic device and a partial region of the lead-frame not encapsulated by the casing, and the first light-transmitting portion and the second light-transmitting portion are respectively positioned at two opposite sides of the lead-frame.

19. The light-emitting diode package according to claim 18, wherein the first cavity has a greater dimension than the second cavity does.

20. The light-emitting diode package according to claim 18, wherein the electronic device comprises a light-emitting diode chip, an electrostatic protection chip, or a control chip.

* * * * *